US012772755B2

(12) United States Patent
Breil et al.

(10) Patent No.: US 12,772,755 B2
(45) Date of Patent: Oct. 20, 2026

(54) CONTACT LAYER FORMATION WITH MICROWAVE ANNEALING FOR NMOS DEVICES

(71) Applicant: Applied Materials, Inc., Santa Clara, CA (US)

(72) Inventors: Nicolas Louis Breil, San Jose, CA (US); Wolfgang R. Aderhold, Cupertino, CA (US); Shashank Sharma, Fremont, CA (US); Nilay Anil Pradhan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 372 days.

(21) Appl. No.: 18/387,732

(22) Filed: Nov. 7, 2023

(65) Prior Publication Data

US 2024/0203742 A1 Jun. 20, 2024

Related U.S. Application Data

(60) Provisional application No. 63/432,620, filed on Dec. 14, 2022.

(51) Int. Cl.
*H10P 14/43* (2026.01)
*H01J 37/32* (2006.01)
*H10P 70/00* (2026.01)

(52) U.S. Cl.
CPC ...... *H10P 14/432* (2026.01); *H01J 37/32357* (2013.01); *H10P 70/27* (2026.01); *H01J 37/321* (2013.01); *H01J 2237/335* (2013.01)

(58) Field of Classification Search
CPC ...... H10P 14/432; H10P 70/27; H10P 14/416; H10P 72/0436; H10P 72/0454; H10P 72/0461; H10P 95/90; H01J 37/32357; H01J 37/321; H01J 2237/335; H10D 64/0112; H10D 64/0113; H10D 84/0149
See application file for complete search history.

(56) References Cited

U.S. PATENT DOCUMENTS

| | | | | |
|---|---|---|---|---|
| 10,438,849 | B2 | 10/2019 | Ren et al. | |
| 2015/0198775 | A1 | 7/2015 | Sandhu | |
| 2017/0287778 | A1 | 10/2017 | Okada et al. | |
| 2018/0145034 | A1* | 5/2018 | Xu | H10W 20/4403 |
| 2018/0175170 | A1* | 6/2018 | Tsai | H10D 30/024 |

(Continued)

FOREIGN PATENT DOCUMENTS

KR 20060007693 A * 1/2006 .......... H10W 20/033

OTHER PUBLICATIONS

International Search Report and Written Opinion dated Apr. 12, 2024 for Application No. PCT/US2023/078900.

(Continued)

*Primary Examiner* — Ratisha Mehta
(74) *Attorney, Agent, or Firm* — Patterson + Sheridan, LLP

(57) ABSTRACT

A method of forming an electrical contact in semiconductor structure includes performing a selective deposition process on a semiconductor structure having a semiconductor region and a dielectric layer having a trench therewithin, the selective deposition process comprising epitaxially forming a contact layer on the semiconductor region within the trench of the dielectric layer, and performing a microwave anneal process to activate dopants in the epitaxially formed contact layer.

20 Claims, 8 Drawing Sheets

(56) References Cited

U.S. PATENT DOCUMENTS

| | | | | |
|---|---|---|---|---|
| 2019/0295903 | A1* | 9/2019 | Clark | H10P 72/0456 |
| 2022/0173107 | A1 | 6/2022 | Moon et al. | |
| 2022/0208829 | A1* | 6/2022 | Chen | H10F 39/024 |

OTHER PUBLICATIONS

C.H. Tsai et al., Achieving junction stability in heavily doped epitaxial Si:P, Materials Science in Semiconductor Processing 127, 105672 (2021).

C.H. Tsai et al., Efficient and stable activation by microwave annealing of nanosheet silicon doped with phosphorus above its solubility limit, Appl. Phys. Lett. 121, 052103 (2022).

* cited by examiner

CONTACT LAYER FORMATION WITH MICROWAVE ANNEALING FOR NMOS DEVICES

CROSS-REFERENCE TO RELATED APPLICATIONS

This application claims priority to U.S. Provisional Application Ser. No. 63/432,620 filed Dec. 14, 2022, which is herein incorporated by reference in its entirety.

BACKGROUND

Field

Embodiments described herein generally relate to semiconductor device fabrication, and more particularly, to systems and methods of forming an electrical contact within a semiconductor structure.

Description of the Related Art

Multi-gate metal-oxide-semiconductor field-effect transistors (MOSFETs), such as complementary metal-oxide semiconductor (CMOS) devices, pose challenges in manufacturability due to their three-dimensional (3D) designs and small sizes. In n-type MOS (n-MOS) devices, a phosphorous (P)-doped silicon (Si) contact layer, doped at a high level such as $3\cdot\times10^{21}$ $cm^{-3}$, epitaxially formed at a bottom of a trench contact is often utilized to lower a contact resistivity. However, during the epitaxial formation of the contact layer at a low temperature, sufficient diffusion of the dopants within the contact layer may be prevented and thus activation of the dopants is at a lower level (e.g., $8\cdot\times10^{10}$ $cm^{-3}$ or lower).

Therefore, there is a need for methods and systems that can activate dopants in an epitaxially formed contact layer in n-MOS devices.

SUMMARY

Embodiments of the present disclosure provide a method of forming an electrical contact in semiconductor structure. The method includes performing a selective deposition process on a semiconductor structure having a semiconductor region and a dielectric layer having a trench therewithin, the selective deposition process comprising epitaxially forming a contact layer on the semiconductor region within the trench of the dielectric layer, and performing a microwave anneal process to activate dopants in the epitaxially formed contact layer.

Embodiments of the present disclosure also provide a method of forming an electrical contact in semiconductor structure. The method includes performing a pre-clean process on a semiconductor structure having a semiconductor region and a dielectric layer having a trench therewithin, the pre-clean process comprising removing contaminants formed on an exposed surface of the semiconductor region within the trench, performing a cavity shaping process to form a cavity on the exposed surface of the semiconductor region within the trench, performing a selective deposition process, the selective deposition process comprising epitaxially forming a contact layer in the cavity in the semiconductor region within the trench of the dielectric layer, and performing a microwave anneal process to activate dopants in the epitaxially formed contact layer.

Embodiments of the present disclosure further provide a processing system. The processing system a first processing chamber, a second processing chamber, and a system controller configured to cause the processing system to perform, in the first processing chamber, a selective deposition process on a semiconductor structure having a semiconductor region and a dielectric layer having a trench therewithin, the selective deposition process comprising epitaxially forming a contact layer on the semiconductor region within the trench of the dielectric layer, and perform, in the second processing chamber, a microwave anneal process to activate dopants in the epitaxially formed contact layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The embodiments described herein provide methods and systems for forming a contact that includes an epitaxial layer of silicon-containing material (e.g., phosphorous-doped silicon) at a selected portion (e.g., on an exposed surface of silicon) of a structure that is used to form an n-MOS device. The methods and systems may be particularly useful for forming, in a semiconductor structure having a semiconductor region that includes silicon and a dielectric layer formed thereover, an epitaxial layer that includes silicon doped with p-type dopants (e.g., phosphorous (P)) at a high concentration, selectively on an exposed surface of the semiconductor region within an opening or feature (e.g., contact trench) formed in the dielectric layer. The dopants in the epitaxial layer are activated by microwave annealing, and thus the resistivity of the epitaxial layer is reduced.

Figure 1:
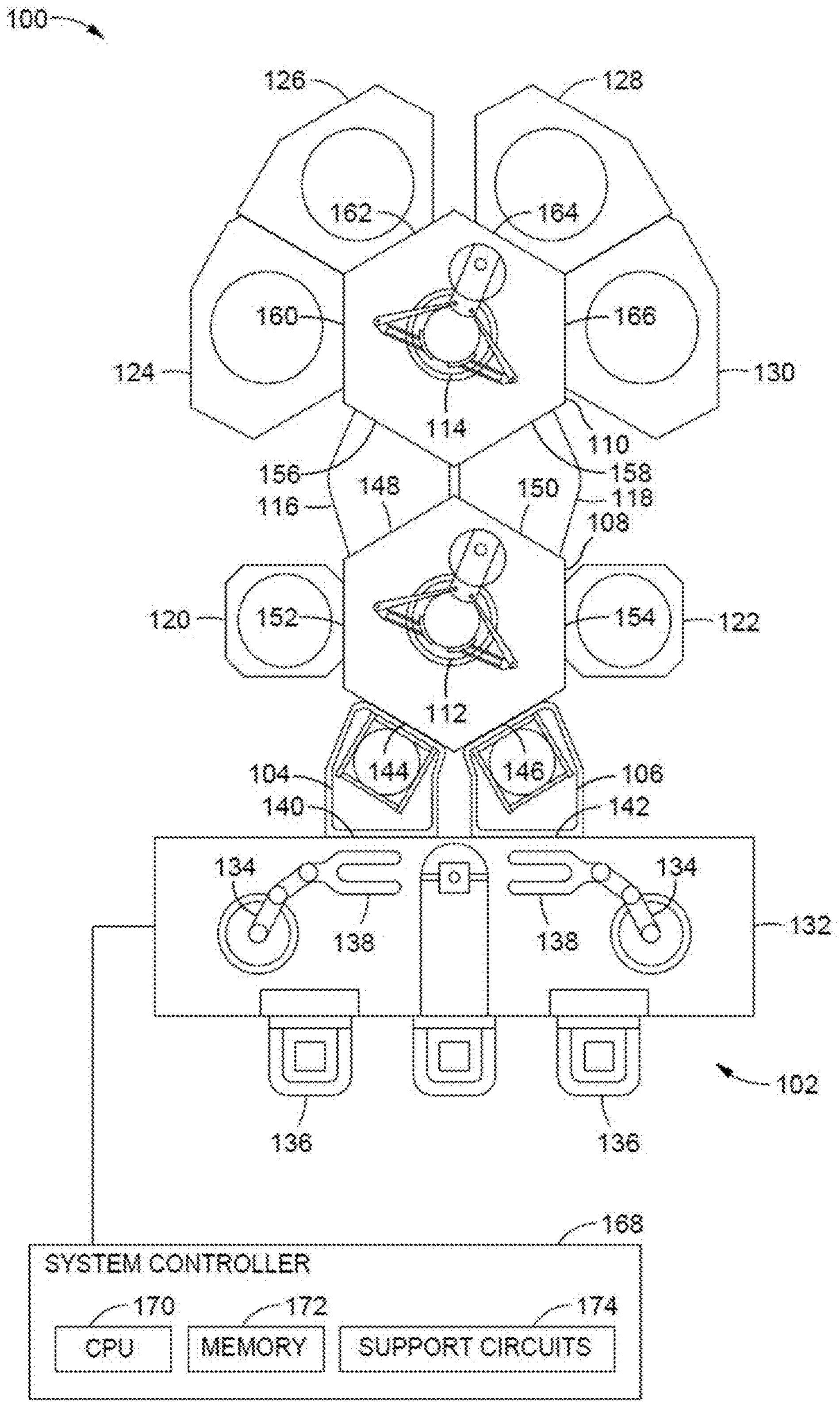
FIG. 1 is a schematic top view of a multi-chamber processing system according to one or more embodiments of the present disclosure.

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing an etch process, the processing chamber 122 can be capable of performing a cleaning process, the processing chamber 124 can be capable of performing a selective removal process, and the processing chambers 126, 128 can be capable of performing respective epitaxial growth processes. The processing chamber 120 may be a Selectra™ Etch chamber available from Applied Materials of Santa Clara, Calif. The processing chamber 122 may be a SiCoNi™ Pre-clean chamber available from Applied Materials of Santa Clara, Calif. The processing chamber 126 or 128, may be a Centura™ Epi chamber available from Applied Materials of Santa Clara, Calif. The processing chamber 130 may be a microwave annealing (MWA) chamber.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Figure 2A:
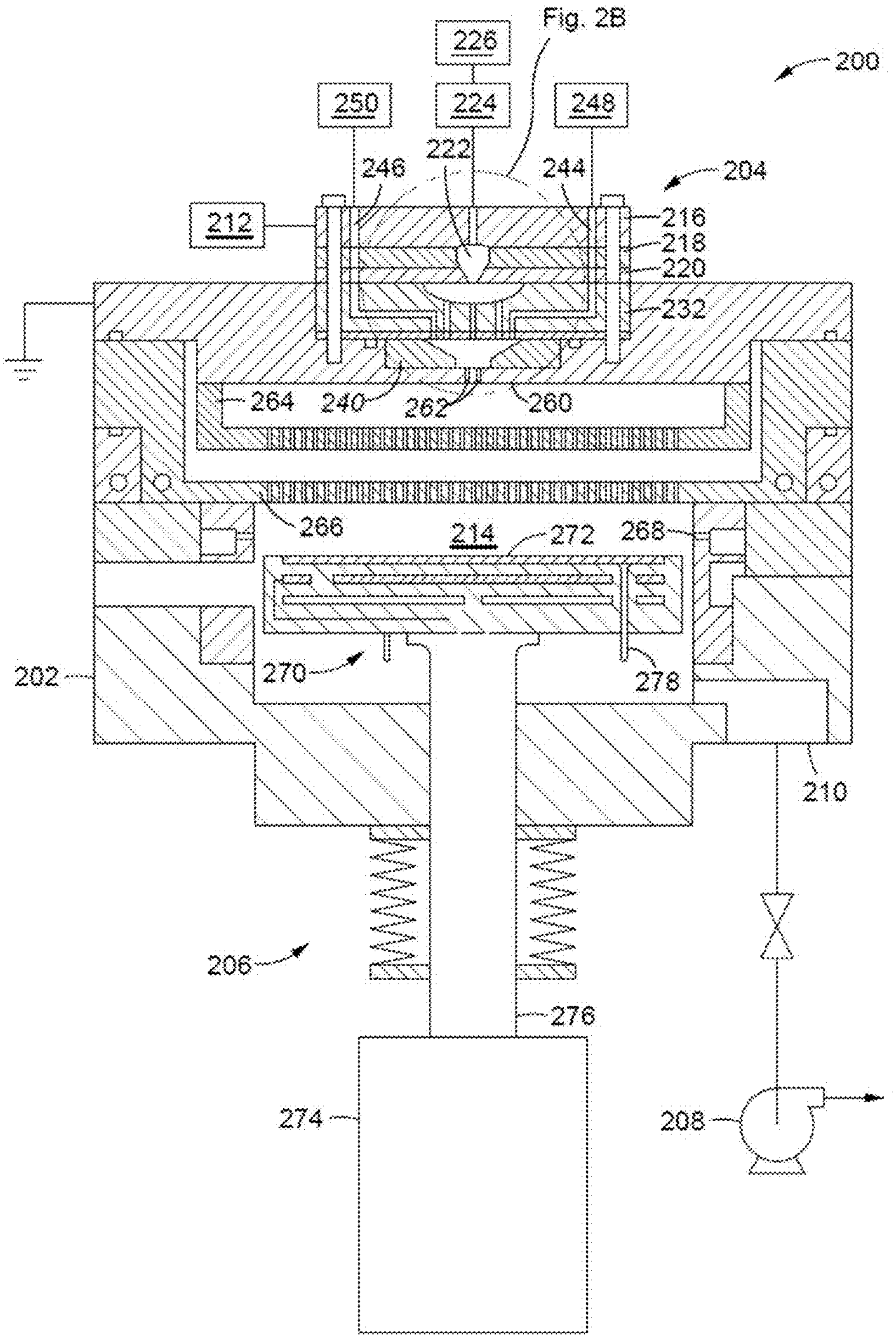
FIG. 2A is a cross sectional view of a processing chamber, according to one or more embodiments.
Figure 2B:
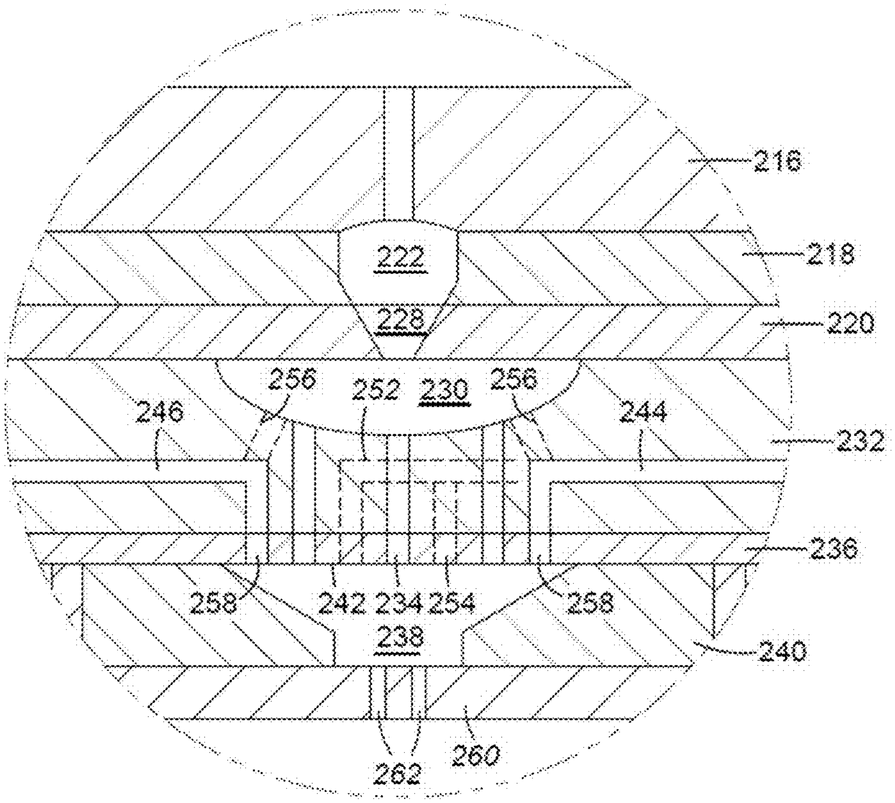
FIG. 2B is an enlarged view of a portion of the processing chamber of FIG. 2A.

FIG. 2A is a cross sectional view of a processing chamber 200, according to one or more embodiments, that is adapted to perform a pre-clean process as detailed below. The processing chamber 200 may be the processing chamber 122 shown in FIG. 1. FIG. 2B is an enlarged view of a portion of the processing chamber 200 of FIG. 2A.

The processing chamber 200 may be particularly useful for performing a thermal or plasma-based cleaning process and/or a plasma assisted dry etch process. The processing chamber 200 includes a chamber body 202, a lid assembly 204, and a support assembly 206. The lid assembly 204 is disposed at an upper end of the chamber body 202, and the support assembly 206 is at least partially disposed within the chamber body 202. A vacuum system can be used to remove gases from processing chamber 200. The vacuum system includes a vacuum pump 208 coupled to a vacuum port 210 disposed in the chamber body 202. The processing chamber 200 also includes a controller 212 for controlling processes within the processing chamber 200.

The lid assembly 204 includes stacked components adapted to provide precursor gases and/or a plasma to a processing region 214 within the processing chamber 200. A first plate 216 is coupled to a second plate 218. A third plate 220 is coupled to the second plate 218. The lid assembly 204 may be connected to a power source (not shown) for supplying a plasma to a cone-shaped chamber 222 formed in the lid assembly 204. The lid assembly 204 can also be connected to a remote plasma source 224 that creates the plasma upstream of the lid stack. The remote plasma cavity (e.g., the processing region 214, the first plate 216, and the second plate 218 in FIGS. 2A-2B) is coupled to a gas source 226 via the remote plasma source 224 (or the gas source 226 is coupled directly to the lid assembly 204 in the absence of the remote plasma source 224). The gas source 226 may include a gas source that is adapted to provide helium, argon, or other inert gas. In some configurations, the gas provided by the gas source 226 can be energized into a plasma that is provided to the lid assembly 204 by use of the remote plasma source 224. In alternate embodiments, the gas source 226 may provide process gases that can be activated by the remote plasma source 224 prior to being introduced to a surface of the substrate that is disposed within the processing chamber 200. Referring to FIG. 2B, the cone-shaped chamber 222 has an opening 228 that allows a formed plasma to flow from the remote plasma source 224 to a volume 230 formed in a fourth plate 232 of the lid assembly 204.

In some configurations of the lid assembly 204, a plasma is generated within the cone-shaped chamber 222 by the application of energy delivered from a plasma source. In one example, the energy can be provided by biasing the lid assembly 204 to capacitively couple RF, VHF and/or UHF energy to the gases positioned in the cone-shaped chamber 222. In this configuration of the lid assembly 204, the remote plasma source 224 may not be used, or not be installed within the lid assembly 204.

A central conduit 234, which is formed in the fourth plate 232, is adapted to provide the plasma generated species provided from the volume 230 through a fifth plate 236 to a mixing chamber 238 formed in a sixth plate 240 of the lid assembly 204. The central conduit 234 communicates with the mixing chamber 238 through an opening 242 in the fifth plate 236. The opening 242 may have a diameter less than, greater than or the same as a diameter of the central conduit 234. In the embodiment of FIG. 2B, the opening 242 has diameter the same as the central conduit 234.

The fourth plate 232 also includes inlets 244 and 246 that are adapted to provide gases to the mixing chamber 238. The inlet 244 is coupled to a first gas source 248 and the inlet 246 is coupled to a second gas source 250. The first gas source 248 and the second gas source 250 may include processing gases as well as inert gases, for example inert gases such as argon and/or helium, utilized as a carrier gas. The first gas source 248 may include ammonia ($NH_3$) as well as argon (Ar). The second gas source 250 may contain fluorine containing gases, hydrogen containing gases, or a combination thereof. In one example, the second gas source 250 may contain hydrogen fluoride (HF) as well as argon (Ar).

As illustrated in FIG. 2B, in some configurations, the inlet 244 is coupled to the mixing chamber 238 through a cylindrical channel 252 (shown in phantom) and holes 254 formed in the fifth plate 236. The inlet 246 is coupled to the mixing chamber 238 through a cylindrical channel 256 (shown in phantom) and holes 258 formed in the fifth plate 236. The holes 254, 258 formed in the fifth plate 236 are generally sized so that they enable a uniform flow of gases, which are provided from their respective gas source 248, 250, into the mixing chamber 238. In one configuration, the holes 258 have a diameter that is less than a width of the opening defined by the opposing sidewalls of the cylindrical channel 256 formed in the fourth plate 232. The holes 258 are typically distributed around the circumference of the center-line of the cylindrical channel 256 to provide uniform fluid flow into the mixing chamber 238. In one configuration, the holes 254 have a diameter that is less than a width of the opening defined by the opposing sidewalls of the cylindrical channel 252 formed the fourth plate 232. The holes 254 are typically distributed around the circumference of the center-line of the cylindrical channel 252 to provide uniform fluid flow into the mixing chamber 238.

The inlets 244 and 246 provide respective fluid flow paths laterally through the fourth plate 232, turning toward and penetrating through the fifth plate 236 to the mixing chamber 238. The lid assembly 204 also includes a seventh plate or first gas distributor 260, which may be a gas distribution plate, such as a showerhead, where the various gases mixed in the lid assembly 204 are flowed through perforations 262 formed therein. The perforations 262 are in fluid communication with the mixing chamber 238 to provide flow pathways from the mixing chamber 238 through the first gas distributor 260. Referring back to FIG. 2A, a blocker plate 264 and a second gas distributor 266, which may be a gas distribution plate, such as a showerhead, is disposed below the lid assembly 204.

Alternatively, a different cleaning process may be utilized to clean the substrate surface. For example, a remote plasma containing helium (He) and ammonia ($NH_3$) may be introduced into the processing chamber 200 through the lid assembly 204, while ammonia ($NH_3$) may be directly injected into the processing chamber 200 via a separate gas inlet 268 that is disposed at a side of the chamber body 202 and coupled to a gas source (not shown).

The support assembly 206 may include a substrate support 270 to support a substrate 272 thereon during processing. The substrate support 270 may be coupled to an actuator 274 by a shaft 276 which extends through a centrally-located opening formed in a bottom of the chamber body 202. The actuator 274 may be flexibly sealed to the chamber body 202 by bellows (not shown) that prevent vacuum leakage around the shaft 276. The actuator 274 allows the substrate support 270 to be moved vertically within the chamber body 202 between a processing position and a loading position. The loading position is slightly below the opening of a tunnel (not shown) formed in a sidewall of the chamber body 202.

The substrate support 270 has a flat, or a substantially flat, substrate supporting surface for supporting a substrate 272 to be processed thereon. The substrate support 270 may be moved vertically within the chamber body 202 by the actuator 274, which is coupled to the substrate support 270 by the shaft 276. For some process operations, the substrate support 270 may be elevated to a position in close proximity to the lid assembly 204 to control the temperature of the substrate 272 being processed. As such, the substrate 272 may be heated via radiation emitted from the second gas distributor 266, or another radiant source, or by convection or conduction from the second gas distributor 266 through an intervening gas. In some process steps, the substrate may be disposed on lift pins 278 to perform additional thermal processing operations, such as performing an annealing step.

Figure 3:
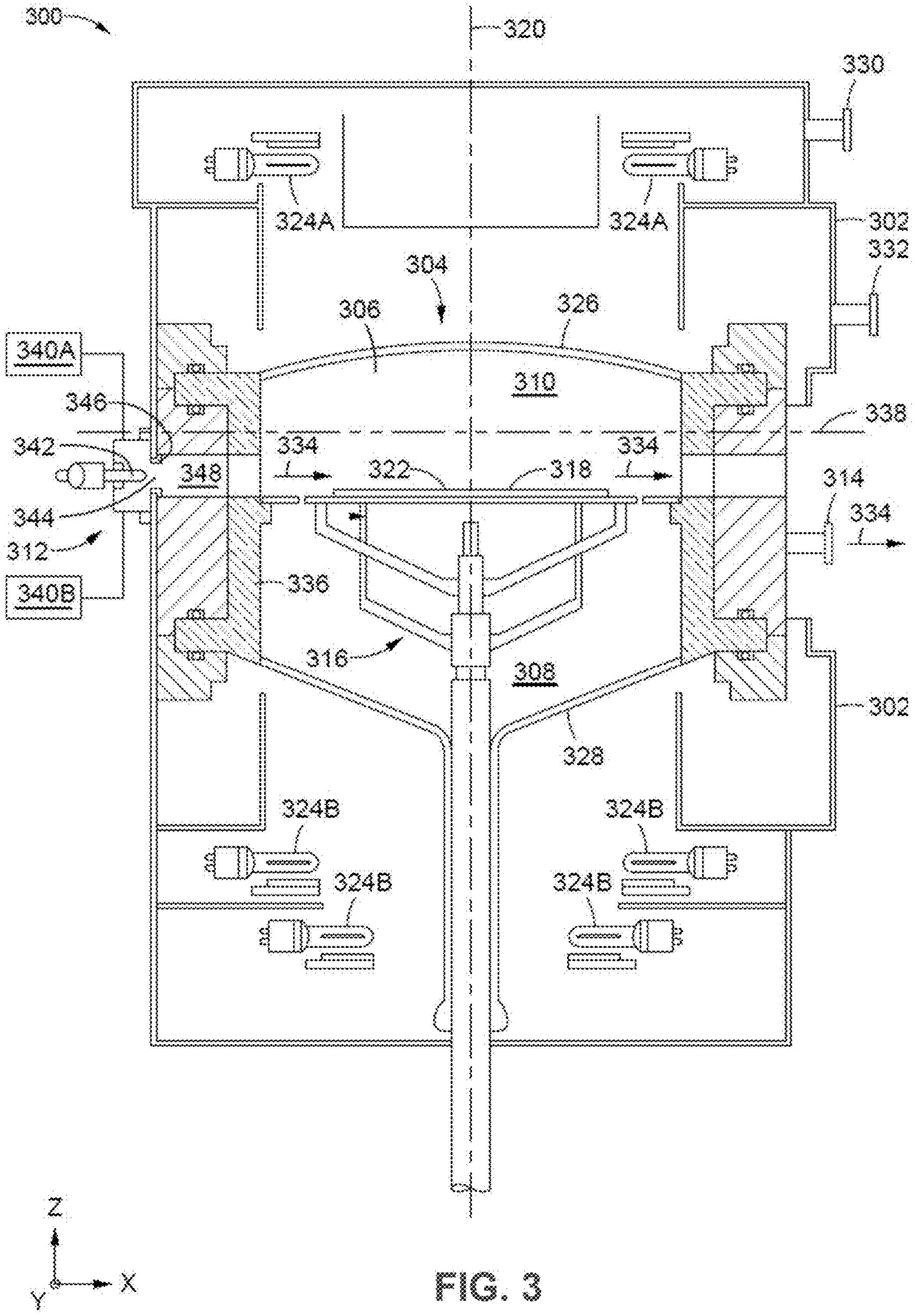
FIG. 3 is a cross sectional view of a processing chamber, according to one or more embodiments.

FIG. 3 is a cross sectional view of a processing chamber 300, according to one or more embodiments, that is adapted to perform an epitaxial (Epi) deposition process as detailed below. The processing chamber 300 may be the processing chamber 126 or 128 shown in FIG. 1.

The processing chamber 300 includes a housing structure 302 made of a process resistant material, such as aluminum or stainless steel, for example 316L stainless steel. The housing structure 302 encloses various functioning elements of the processing chamber 300, such as a quartz chamber 304, which includes an upper quartz chamber 306, and a lower quartz chamber 308, in which a processing volume 310 is contained. Reactive species are provided to the quartz chamber 304 by a gas distribution assembly 312, and processing byproducts are removed from the processing volume 310 by an outlet port 314, which is typically in communication with a vacuum source (not shown).

A substrate support 316 is adapted to receive a substrate 318 that is transferred to the processing volume 310. The substrate support 316 is disposed along a longitudinal axis 320 of the processing chamber 300. The substrate support 316 may be made of a ceramic material or a graphite material coated with a silicon material, such as silicon carbide, or other process resistant material. Reactive species from precursor reactant materials are applied to a surface 322 of the substrate 318, and byproducts may be subsequently removed from the surface 322 of the substrate 318. Heating of the substrate 318 and/or the processing volume 310 may be provided by radiation sources, such as upper lamp modules 324A and lower lamp modules 324B.

In one embodiment, the upper lamp modules 324A and the lower lamp modules 324B are infrared (IR) lamps. Non-thermal energy or radiation from the lamp modules 324A and 324B travels through an upper quartz window 326 of the upper quartz chamber 306, and through a lower quartz window 328 of the lower quartz chamber 308. Cooling gases for the upper quartz chamber 306, if needed, enter through an inlet 330 and exit through an outlet 332. Precursor reactant materials, as well as diluent, purge and vent gases for the processing chamber 300, enter through the gas distribution assembly 312 and exit through the outlet port 314. While the upper quartz window 326 is shown as being curved or convex, the upper quartz window 326 may be planar or concave as the pressure on both sides of the upper quartz window 326 is substantially the same (i.e., atmospheric pressure).

The low wavelength radiation in the processing volume 310, which is used to energize reactive species and assist in adsorption of reactants and desorption of process byproducts from the surface 322 of the substrate 318, typically ranges from about 0.8 μm to about 1.2 μm, for example, between about 0.95 μm to about 1.05 μm, with combinations of various wavelengths being provided, depending, for example, on the composition of the film which is being epitaxially grown.

The component gases enter the processing volume 310 via the gas distribution assembly 312. Gas flows from the gas distribution assembly 312 and exits through the outlet port 314 as shown generally by a flow path 334. Combinations of component gases, which are used to clean/passivate a substrate surface, or to form the silicon and/or germanium-containing film that is being epitaxially grown, are typically mixed prior to entry into the processing volume 310. The overall pressure in the processing volume 310 may be adjusted by a valve (not shown) on the outlet port 314. At least a portion of the interior surface of the processing volume 310 is covered by a liner 336. In one embodiment, the liner 336 comprises a quartz material that is opaque. In this manner, the chamber wall is insulated from the heat in the processing volume 310.

The temperature of surfaces in the processing volume 310 may be controlled within a temperature range of about 200° C. to about 600° C., or greater, by the flow of a cooling gas, which enters through the inlet 330 and exits through the outlet 332, in combination with radiation from the upper lamp modules 324A positioned above the upper quartz window 326. The temperature in the lower quartz chamber 308 may be controlled within a temperature range of about 200° C. to about 600° C. or greater, by adjusting the speed of a blower unit which is not shown, and by radiation from the lower lamp modules 324B disposed below the lower quartz chamber 308. The pressure in the processing volume 310 may be between about 0.1 Torr to about 600 Torr, such as between about 5 Torr to about 30 Torr.

The temperature on the surface 322 of the substrate 318 may be controlled by power adjustment to the lower lamp modules 324B in the lower quartz chamber 308, or by power adjustment to both the upper lamp modules 324A overlying the upper quartz window 326, and the lower lamp modules 324B in the lower quartz chamber 308. The power density in the processing volume 310 may be between about 40 $W/cm^2$ to about 400 $W/cm^2$, such as about 80 $W/cm^2$ to about 120 $W/cm^2$.

In one aspect, the gas distribution assembly 312 is disposed normal to, or in a radial direction 338 relative to, the longitudinal axis 320 of the processing chamber 300 or the substrate 318. In this orientation, the gas distribution assembly 312 is adapted to flow process gases in the radial direction 338 across, or parallel to, the surface 322 of the substrate 318. In one processing application, the process gases are preheated at the point of introduction to the processing chamber 300 to initiate preheating of the gases prior to introduction to the processing volume 310, and/or to break specific bonds in the gases. In this manner, surface reaction kinetics may be modified independently from the thermal temperature of the substrate 318.

In operation, precursors used to form silicon (Si) and silicon germanium (SiGe) blanket or selective epitaxial films are provided to the gas distribution assembly 312 from one or more gas sources 340A and 340B. IR lamps 342 (only one is shown in FIG. 3) may be utilized to heat the precursors within the gas distribution assembly 312 as well as along the flow path 334. The gas sources 340A, 340B may be coupled the gas distribution assembly 312 in a manner adapted to facilitate introduction zones within the gas distribution assembly 312, such as a radial outer zone and a radial inner zone between the outer zones when viewed in from a top plan view. The gas sources 340A, 340B may include valves (not shown) to control the rate of introduction into the zones.

The gas sources 340A, 340B may include silicon precursors such as silanes, including silane ($SiH_4$), disilane ($Si_2H_6$,), dichlorosilane ($SiH_2Cl_2$), hexachlorodisilane ($Si_2Cl_6$), dibromosilane ($SiH_2Br_2$), higher order silanes, derivatives thereof, and combinations thereof. The gas sources 340A, 340B may also include germanium containing precursors, such as germane ($GeH_4$), digermane ($Ge_2H_6$), germanium tetrachloride ($GeCl_4$), dichlorogermane ($GeH_2Cl_2$), derivatives thereof, and combinations thereof. The silicon and/or germanium containing precursors may be used in combination with hydrogen chloride (HCl), chlorine gas ($Cl_2$), hydrogen bromide (HBr), and combinations thereof. The gas sources 340A, 340B may include one or more of the silicon and germanium containing precursors in one or both of the gas sources 340A, 340B.

The precursor materials enter the processing volume 310 through openings or holes 344 (only one is shown in FIG. 3) in the perforated plate 346 in this excited state, which in one embodiment is a quartz material, having the holes 344 formed therethrough. The perforated plate 346 is transparent to IR energy, and may be made of a clear quartz material. In other embodiments, the perforated plate 346 may be any material that is transparent to IR energy and is resistant to process chemistry and other processing chemistries. The energized precursor materials flow toward the processing volume 310 through the holes 344 in the perforated plate 346, and through channels 348 (only one is shown in FIG. 3). A portion of the photons and non-thermal energy from the IR lamps 342 also passes through the holes 344, the perforated plate 346, and channels 348 facilitated by a reflective material and/or surface disposed on the interior surfaces of the gas distribution assembly 312, thereby illuminating the flow path 334 of the precursor materials. In this manner, the vibrational energy of the precursor materials may be maintained from the point of introduction to the processing volume 310 along the flow path.

Figure 4:
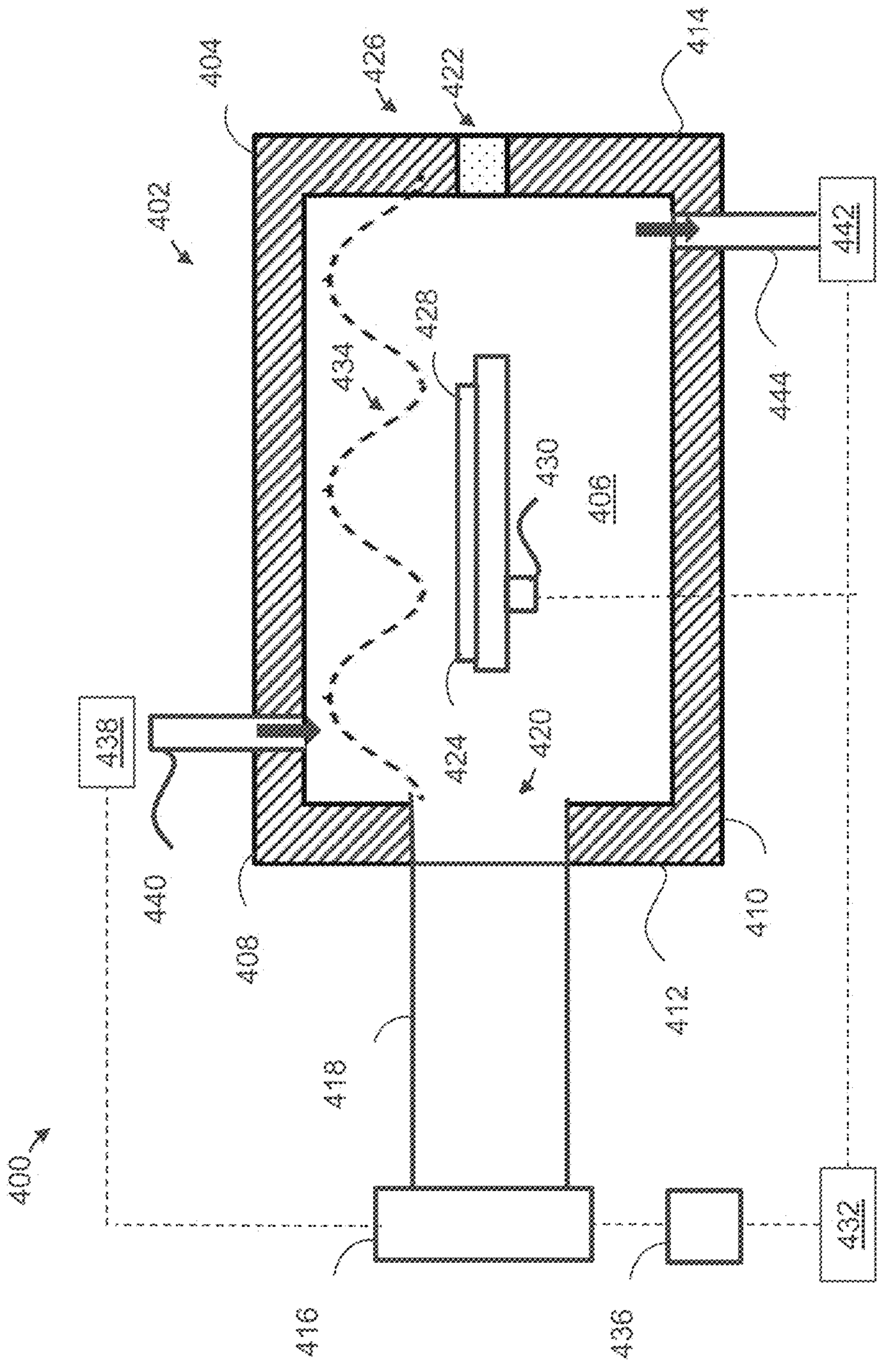
FIG. 4 is a cross sectional view of a processing system, according to one or more embodiments.

FIG. 4 is a cross sectional view of a processing system 400 including a processing chamber 402, according to one or more embodiments, that is adapted to perform a microwave anneal process as detailed below. The processing chamber 402 may be the processing chamber 130 shown in FIG. 1.

The processing chamber 402 includes a chamber body 404. The chamber body 404 at least partially defining a processing volume 406. In some embodiments, the chamber body 404 includes a top wall 408 (e.g., a ceiling or lid), a bottom wall 410 (e.g., a floor) opposite the top wall 408, a first sidewall 412 coupling the top wall 408 and the bottom wall 410, and a second sidewall 414 opposite the first sidewall 412. The chamber body 404 may be or include any material suitable with the processes performed in the processing chamber 402. For example, suitable materials fort the chamber body 404 include aluminum, stainless steel, ceramic materials, or a combination thereof.

The processing system 400 further includes a microwave source 416. The microwave source 416 can be continuous or pulsed. The microwave source 416 may be coupled with the chamber body 404 via a waveguide 418. The electromagnetic energy generated by the microwave source 416 may be supplied into the processing volume 406 from a waveguide launch port 420, which is fluidly coupled with the processing volume 406 via the waveguide 418. Although FIG. 4 shows the waveguide launch port 420 disposed along the first sidewall 412 of the chamber body 404, the waveguide launch port 420 may also be placed in other locations such as the bottom wall 410, the second sidewall 414, the top wall 408, or a combination of different locations.

At least one substrate support pedestal 422 is disposed in the processing volume 406 to support one or more substrates 424 thereupon during processing. The substrate(s) 424 can be brought into the processing volume 406 through a loading port 426. The substrate(s) 424 can include a major surface 428 on which devices and/or deposition takes place. The substrate support pedestal 422 may be any support pedestal for holding one or more semiconductor substrates and may include such components as an electrostatic chuck, clamps, edge rings, guide pins, or the like for physically locating and retaining the substrate. In some embodiments, the substrate support pedestal 422 is configured for rotation during processing. In some embodiments, the substrate support pedestal 422 includes additional components for processing the substrate(s) 424, such as an electrode for supplying DC or RF bias power, systems for the uniform supply or removal of heat from the substrate(s) 424 or a surface of the substrate support pedestal 422, or the like.

In some embodiments, the processing system 400 further includes a substrate temperature sensor 430. The substrate temperature sensor 430 may be embedded in the substrate support pedestal 422. The substrate temperature sensor 430 is connected to a system controller 432. In some embodiments, the substrate temperature monitored by the substrate temperature sensor 430 is used to control the operation of the microwave source 416 in response to the monitored substrate temperature. A pyrometer (not shown) may be used to measure radiation from the substrate 424 through a hole in the upper end of the chamber body 202.

In some embodiments, the microwave source 416 is positioned to heat the entire substrate(s) 424. The microwave source 416 may be positioned to deliver emitted electromagnetic energy 434 parallel to the major surface 428 of the substrate(s) 424 positioned on the substrate support pedestal 422.

In some embodiments, the microwave source 416 is a microwave generator that generates a fixed frequency microwave or a variable frequency microwave. The microwave generated in the microwave generator is suppled into the processing volume 406 from the waveguide launch port 420 via the waveguide 418. In one embodiment, the frequency of microwave supplied is in a range from about 1 GHz to about 30 GHz. In another embodiment the frequency of microwave supplied is in a range from about 1 GHz to about 10 GHZ, or in a range from about 2 GHz to about 5 GHZ, for example, 2.45 GHZ. However, other applicable frequencies may also be used. The power of microwave may be in range from about 1000 watts to about 7000 watts, or in a range from about 1000 watts to about 3000 watts. In one example, the microwave generator outputs up to 20 KW of power at a frequency of about 2.54 gigahertz (GHz).

The system controller 432 may control the phase, frequency, and other parameters of the emitted electromagnetic energy 434. For example, in some embodiments where the microwave source 416 is a microwave signal generator, the system controller 432 controls the phase, frequency, and other parameters of the microwave signal output from the microwave signal generator.

In some embodiments, the processing system 400 further includes a phase-frequency detector 436 for detecting the phase and/or frequency of the emitted electromagnetic energy 434 from the microwave source 416. The phase-frequency detector 436 may be connected with the microwave source 416 and the system controller 432. The phase-frequency detector 436 may be used in a feedback process, where the phase-frequency detector 436 detects the phase, frequency, and/or other parameters of the emitted electromagnetic energy 434 and the system controller 432 adjusts the microwave source 416 based on input from the phase-frequency detector 436.

In some embodiments, the processing system 400 further includes a gas supply 438. The gas supply 438 may be fluidly coupled with the processing volume via a gas inlet 440. The gas supply 438 provides one or more suitable process gases for processing the substrate(s) 424 and/or for maintaining the processing volume 406 (such as annealing gases, deposition gases, etch gases, cleaning gases, or the like). The gases may be reactive, such as precursors for deposition processes, or non-reactive, such as inert gases commonly used in conventional thermal processes. The processing volume 406 within which the substrate(s) 424 resides during processing may be evacuated or contain a gas suitable for the targeted process. In one implementation, the gas supply 438 comprises a plurality of gas sources supplying one or more process gases to the processing volume 406. Each process gas may be supplied independently, or in combination with additional process gases. Other components for controlling the flow of gases to the processing volume 406, such as flow controllers, valves, or the like, are, for simplicity, not shown.

In some embodiments, the system controller 432 operates to facilitate control and automation of various aspects of the thermal anneal techniques, for example, the method 500, and the processing system 400. The system controller 432 facilitates the control and automation of the processing system 400 and can include a central processing unit (CPU), memory, and support circuits (or I/O). The CPU may be one of any form of computer processors that are used in industrial settings for controlling various processes and hardware (e.g., conventional electromagnetic radiation detectors, motors, laser hardware, microwave hardware) and monitor the processes (e.g., substrate temperature, substrate support temperature, amount of energy from the microwave source, amount of energy from the pulsed laser, detector signal). Software instructions and data can be coded and stored within the memory for instructing the CPU. The system controller 432 can communicate with one or more of the components of the processing system 400 via, for example, a system bus. A program (or computer instructions) readable by the system controller 432 determines which tasks are performable on a substrate. In some embodiments, the program is software readable by the controller and includes code to monitor and control the substrate position, the amount of energy delivered in the continuous electromagnetic energy emitted, the amount of energy delivered in each electromagnetic pulse, the timing of one or more electromagnetic pulses, the intensity and wavelength as a function of time for each pulse, the temperature of various regions of the substrate, or any combination thereof. Although the system controller 432 is shown as a single system controller, it should be appreciated that multiple system controllers can be used with the embodiments described herein.

In some embodiments, the processing system 400 further includes an exhaust system 442. In one implementation, the exhaust system 442 is coupled to the processing chamber 402 via an exhaust port 444. The exhaust system 442 may be coupled to the processing chamber 402 at any suitable location for exhausting the processing volume 406, such as along the bottom wall 410 of the chamber body 404, as illustrated in FIG. 4. For example, depending upon chamber design and process gas flow considerations, the exhaust port 444 may be located at any suitable location in the processing chamber 402, such as in the sidewall 412, 414 of the processing chamber 402, above or below the surface of the substrate support pedestal 422, in the top wall 408 of the processing chamber 402, in the bottom wall 410 of the processing chamber 402, or in any other suitable location.

Figure 5:
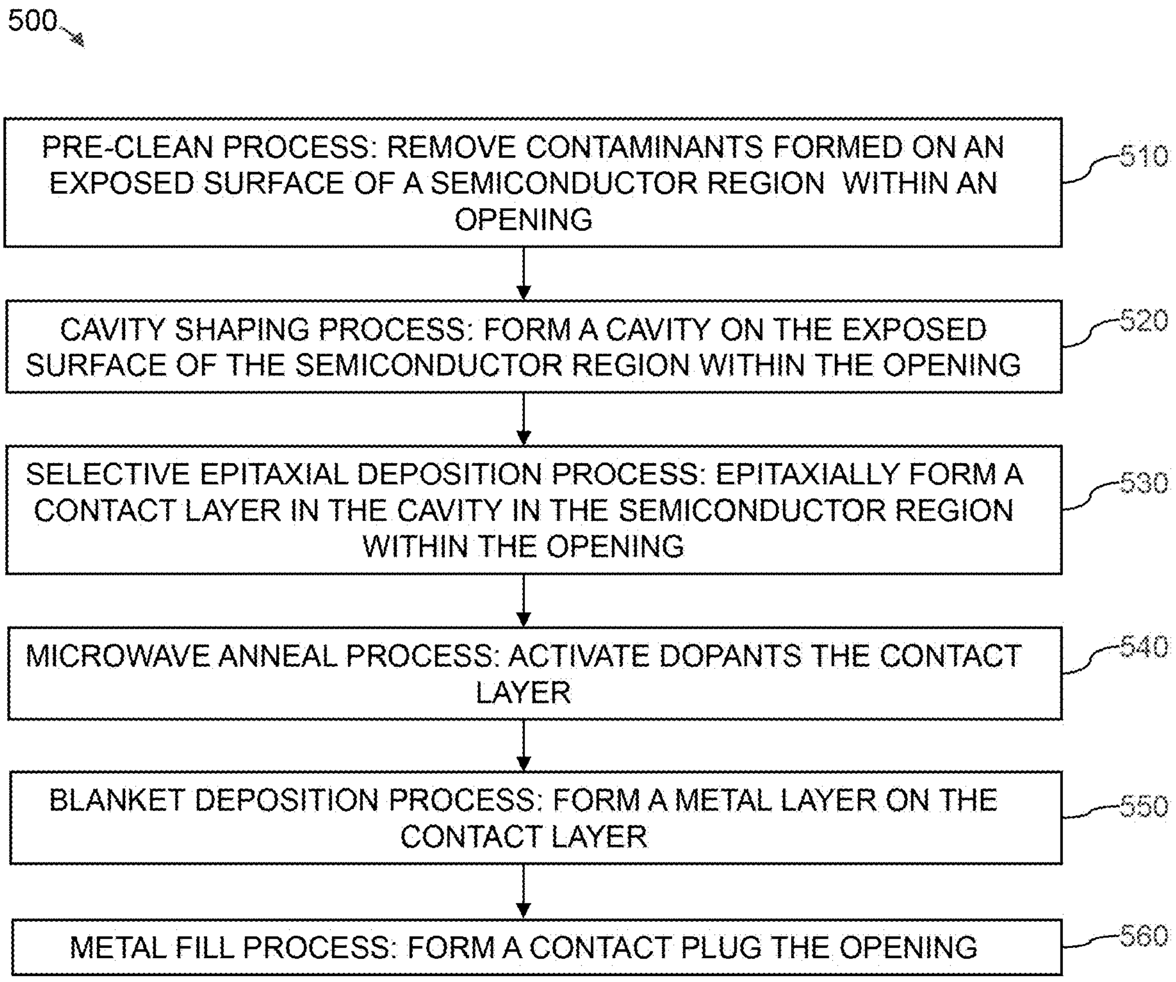
FIG. 5 depicts a process flow diagram of a method of forming a contact layer in a semiconductor structure according to a first embodiment of the present disclosure.

FIG. 5 depicts a process flow diagram of a method 500 of forming a contact layer in a semiconductor structure 600 formed on a substrate according to one embodiment of the present disclosure. FIGS. 6A, 6B, 6C, 6D, and 6E are cross-sectional views of a portion of the semiconductor structure 600 corresponding to various states of the method 500. It should be understood that FIGS. 6A, 6B, 6C, 6D, and 6E illustrate only partial schematic views of the semiconductor structure 600, and the semiconductor structure 600 may contain any number of transistor sections and additional materials having aspects as illustrated in the figures. It should also be noted that although the method illustrated in FIG. 5 is described sequentially, other process sequences that include one or more operations that have been omitted and/or added, and/or has been rearranged in another desirable order, fall within the scope of the embodiments of the disclosure provided herein.

The term "substrate" as used herein refers to a layer of material that serves as a basis for subsequent processing operations and includes a surface to be cleaned. The substrate may be a silicon based material or any suitable insulating materials or conductive materials as needed. The substrate may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire.

Figure 6A:
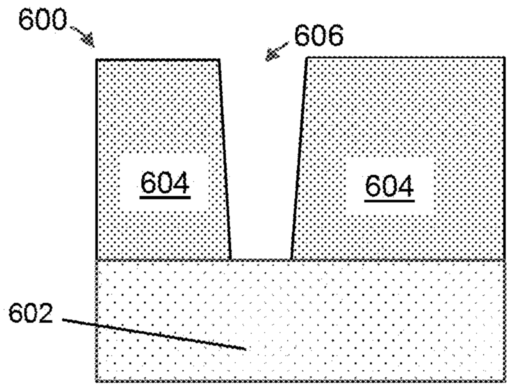
FIGS. 6A, 6B, 6C, 6D, and 6E are cross-sectional views of a portion of a semiconductor structure corresponding to various states of the method of FIG. 5.

As shown in FIG. 6A, the semiconductor structure 600 includes a semiconductor region 602 formed on a substrate (not shown). The semiconductor region 602 may be formed of a first material such as silicon (Si), and doped with n-type dopants such as phosphorus (P), arsenic (As), or antimony (Sb), with the concentration of between about $10^{19}$ $cm^{-3}$ and $5 \cdot 10^{21}$ $cm^{-3}$.

The semiconductor structure 600 further includes a dielectric layer 604 having a trench 606 formed over the semiconductor region 602. The dielectric layer 604 may be formed of a dielectric material, such as silicon dioxide ($SiO_2$) or silicon nitride ($Si_3N_4$).

The semiconductor region 602 and the dielectric layer 604 may be formed using any suitable deposition technique, such as epitaxial (Epi) deposition, chemical vapor deposition (CVD), atomic layer deposition (ALD), or physical vapor deposition (PVD), and the trench 606 may be formed by a patterning technique, such as a lithography and etch process.

The method 500 begins with a pre-clean process in block 510. The pre-clean process may be performed in an etch chamber, such as the processing chamber 122 shown in FIG. 1, or the processing chamber 200 shown in FIG. 2. The pre-clean process in block 510 may be performed without breaking vacuum environment in a multi-chamber processing system, such as the multi-chamber processing system 100 shown in FIG. 1.

The pre-clean process removes contaminants, such as native oxide layers, or patterning residues (e.g., fluorocarbons) formed on an exposed surface of the semiconductor region 602 within the trench 606. The pre-clean process is used to prepare the exposed surface of the semiconductor region 602 within the trench 606 on which an epitaxial layer can be formed in a subsequent epitaxial deposition process.

The pre-clean process may include an anisotropic remote plasma assisted dry etch process, such as a reactive ion etching (RIE) process, using a plasma formed from a gas including argon (Ar), helium (He), or a combination thereof. The plasma effluents directionally bombard and remove a remaining dielectric layer within the trench 606.

The pre-clean process may include an isotropic plasma etching process, such as a SiCoNi™ dry chemical etching process, using a plasma formed from a gas including ammonia ($NH_3$), nitrogen trifluoride ($NF_3$), hydrogen fluoride (HF), or a combination thereof, and a carrier gas, such as nitrogen ($N_2$), hydrogen ($H_2$), or a combination thereof. The dry chemical etching process is selective for oxide layers, and thus does not readily etch silicon, germanium, or nitride layers regardless of whether the layers are amorphous, crystalline, or polycrystalline. Selectivity of the dry chemical etching process for oxide versus silicon or germanium is at least about 3:1, and usually 5:1 or better, sometimes 10:1. The dry chemical etching process is also highly selective of oxide versus nitride. The selectivity of the dry chemical etching process versus nitride is at least about 3:1, usually 5:1 or better, sometimes 10:1.

The pre-clean process may include an inductively coupled plasma (ICP) etching process, using a plasma formed from a gas including chlorine ($Cl_2$) and hydrogen ($H_2$), and a carrier gas including argon (Ar) and helium (He).

Figure 6B:
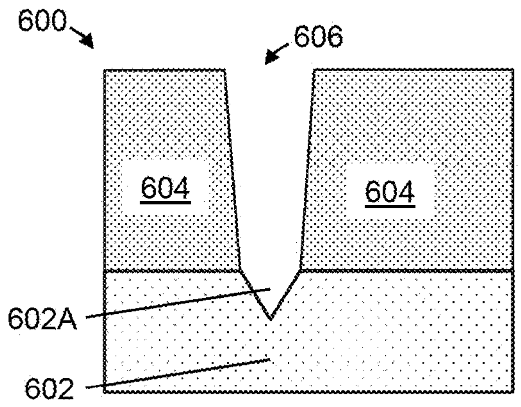

In block 520, a cavity shaping process is performed to form a cavity 602A on the exposed surface of the semiconductor region 602 within the trench 606, as shown in FIG. 6B. The cavity shaping process may be performed in an etch chamber, such as the processing chamber 120 shown in FIG. 1. The cavity shaping process in block 520 may be performed without breaking vacuum environment in a multi-chamber processing system, such as the multi-chamber processing system 100 shown in FIG. 1.

The cavity shaping process in block 520 includes an etch process using an etching gas including halogen-containing gas, such as chlorine ($Cl_2$), hydrogen chloride (HCl), or hydrogen fluoride (HF), and carrier gas, such as include argon (Ar), or helium (He).

The cavity 602A may have a V-shape, a U-shape, or any other shape, having a width of between about 5 nm and about 15 nm and a depth of between about 5 nm and about 15 nm, and enlarge a contact area between the semiconductor region 602 and a contact plug to be formed within the trench 606, to minimize parasitic resistance, leading to an improved device performance.

Figure 6C:
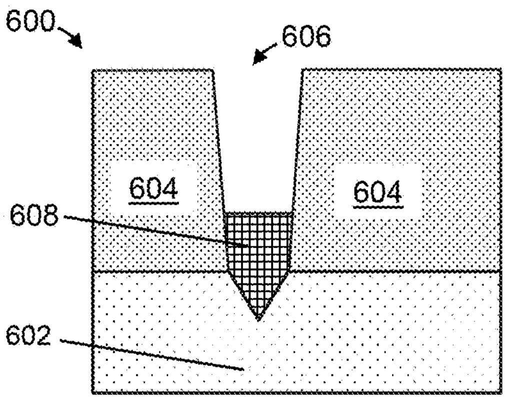

In block 530, a selective epitaxial deposition process is performed to epitaxially form a contact layer 608 in the cavity 602A in the semiconductor region 602 within the trench 606, as shown in FIG. 6C. The selective epitaxial deposition process may be performed in an epi chamber, such as the processing chamber 126 or 128 shown in FIG. 1, or the processing chamber 300 shown in FIG. 3. The selective epitaxial deposition process in block 530 may be performed without breaking vacuum environment in a multi-chamber processing system, such as the multi-chamber processing system 100 shown in FIG. 1.

The contact layer 608 is formed as interfaces between the semiconductor region 602 and a metal contact plug to be formed within the trench 606, to minimize parasitic resistance. The contact layer 608 may be formed of a second material, such as silicon (Si), doped with n-type dopants such as phosphorus (P), arsenic (As), or antimony (Sb), with the concentration of between about $10^{19}$ $cm^{-3}$ and $5{\cdot}{\times}10^{21}$ $cm^{-3}$, depending upon the desired conductive characteristic of the contact layer 608.

In some embodiments, the selective epitaxial deposition process includes a deposition process and an etch process. The deposition process is an epitaxial deposition process. The selectivity in the selective epitaxial deposition process may arise from differences in nucleation of the second material on the exposed surface of the semiconductor region 602 (e.g., silicon (Si)) from that on exposed surfaces of the dielectric layer 604 (e.g., silicon dioxide ($SiO_2$) or silicon nitride ($Si_3N_4$)). The nucleation may occur at a faster rate on the exposed surface of the semiconductor region 602 (e.g., silicon (Si)) than on the exposed surfaces of the dielectric layer 604 (e.g., silicon dioxide ($SiO_2$) or silicon nitride ($Si_3N_4$)), and thus an epitaxial layer of the second material may be formed on the exposed surface of the semiconductor region 602 (e.g., silicon (Si)), while an amorphous layer of the second material may be formed on the exposed surfaces of the dielectric layer 604 (e.g., silicon dioxide ($SiO_2$) or silicon nitride ($Si_3N_4$)), when the semiconductor structure 600 is exposed to a deposition gas in the deposition process. In the subsequent etch process, the amorphous layers of the second material formed on the exposed surfaces of the dielectric layer 604 can be removed at a faster rate than the epitaxial layers of the second material formed on the exposed surface of the semiconductor region 602, by an appropriate etching gas. Thus, an overall result of the deposition process and the etch process combined can be epitaxial growth of the second material on the exposed surface of the semiconductor region 602, while minimizing growth, if any, of the second material on the exposed surfaces of the dielectric layer 604.

In some embodiments, the deposition gas includes a silicon-containing precursor and a dopant source. The silicon-containing precursor may include silane ($SiH_4$), disilane ($Si_2H_6$), tetrasilane ($Si_4H_{10}$), or a combination thereof. The dopant source may include a precursor phosphine($PH_3$), phosphorus trichloride ($PCl_3$), triisobutylphosphine ($[(CH_3)_3C]_3P$), arsine ($AsH_3$), arsenic trichloride ($AsCl_3$), tertiarybutylarsine ($AsC_4H_{11}$), antimony trichloride ($SbCl_3$), $Sb(C_2H_5)_5$. The etching gas includes an etchant gas and a carrier gas. The etchant gas may include halogen-containing gas, such as hydrogen chloride (HCl), chlorine ($Cl_2$), or hydrogen fluoride (HF). The carrier gas may include nitrogen ($N_2$), argon (Ar), helium (He), or hydrogen ($H_2$).

The deposition process and the etch process may be performed at a low temperature of between about 200° C. and about 800° C., and at a pressure of between 5 Torr and 600 Torr. Due to the low temperature epitaxial deposition of the contact layer 608 and high concentration (e.g., $3{\cdot}{\times}10^{21}$ $cm^{-3}$) of dopants (e.g., phosphorus (P)), the dopants may be active only at a level (e.g., 8‰×$10^{10}$ $cm^{-3}$) or lower in the contact layer 608 as deposited in block 530. Clustering of dopants in defects in the silicon (Si) lattice in the contact layer 608 as deposited may cause deactivation of the dopants. The clustering of dopants will be segregated by a subsequent microwave anneal process to activate the dopants.

A cycle of the deposition and etch processes may be repeated as needed to obtain a desired thickness of the contact layer 608. A thickness of the contact layer 608 may be between about 30 Å and about 100 Å.

In block 540, a microwave anneal process is performed to activate dopants the contact layer 608. The microwave anneal process may be performed in a microwave annealing chamber, such as the processing chamber 130 shown in FIG. 1, or the processing chamber 402 shown in FIG. 4. In some embodiments, the microwave anneal process may be performed in an epi chamber, such as the processing chamber 126 or 128 shown in FIG. 1, or the processing chamber 300 shown in FIG. 3, which is connected to a microwave source via a wave guide, such as the microwave source 416 and the waveguide 418, shown in FIG. 4. The microwave anneal process in block 540 may be performed without breaking vacuum environment in a multi-chamber processing system, such as the multi-chamber processing system 100 shown in FIG. 1.

In the microwave anneal process, a surface of the contact layer 608 is exposed to and thermally annealed by microwave radiation at a frequency of about 2.54 GHZ, for a time period up to about 1000 seconds. A microwave power may be above 20 KW. The surface of the contact layer 608 may be heated at a temperature of about 700° C.

Figure 7:
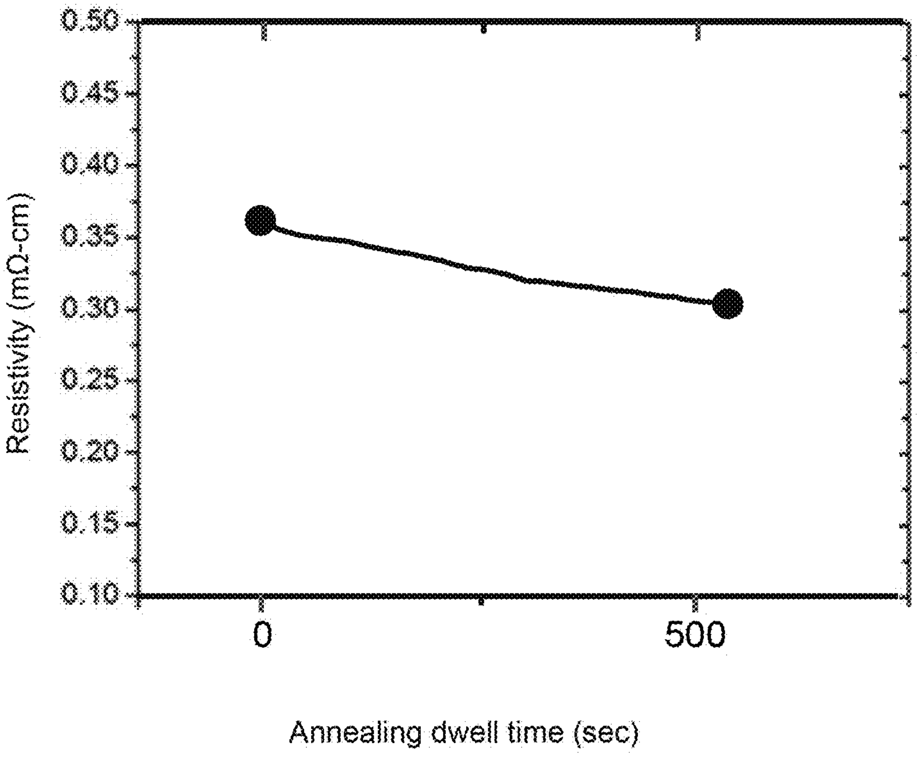
FIG. 7 depicts an example of resistivity of a phosphorus (P)-doped silicon (Si) sample as a function of a microwave annealing dwell time.

By the microwave anneal process, dopants (e.g., phosphorus (P)) in the contact layer 608 as deposited in block 530, may be activated. This activation of the dopants may be due to segregating of dopants that were clustered in defects in the silicon (Si) lattice. The clustering of dopants in the contact layer 608 as deposited may cause deactivation of the dopants and thus segregating clusters of dopants may activate the dopants, reducing resistivity. The inventors of the present disclosure have shown that resistivity of a phosphorus (P)-doped silicon (Si) sample (a 300 mm silicon wafer with phosphorus-doped with the concentration of between about $10^{20}$ $cm^{-3}$ and $510^{21}$ $cm^{-3}$) has reduced about 8% by a microwave anneal for an annealing dwell time of about 60 seconds, as shown in FIG. 7. This result indicates activation of dopants by the microwave anneal process.

In some embodiments, the microwave anneal process is also used to repair the dielectric layer 604 that may have been damaged during the selective epitaxial deposition process in block 530.

Figure 6D:
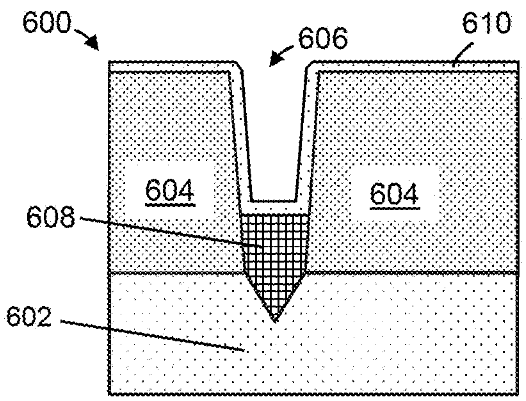

In block 550, a blanket deposition process is performed to form a metal layer 610 on the contact layer 608, as shown in FIG. 6D. The blanket deposition process may be performed in a different processing chamber from the epi chamber in block 530 or the microwave annealing chamber in block 540, such as the processing chamber 126 or 128 shown in FIG. 1, or the processing chamber 300 shown in FIG. 3. The blanket deposition process in block 550 may be performed without breaking vacuum environment in a multi-chamber processing system, such as the multi-chamber processing system 100 shown in FIG. 1.

The metal layer 610 contacts the contact layer 608 and provides an electrical connection between a contact plug to be formed within the trench 606 and the semiconductor region 602, while maintaining an electrical connection therethrough. The metal layer 610 may be formed of a metal material, such as titanium (Ti), cobalt (Co), nickel (Ni), molybdenum (Mo), or tantalum (Ta), or silicide thereof.

In some embodiments, the metal source may include a precursor that includes titanium (Ti), tantalum (Ta), cobalt (Co), nickel (Ni), or molybdenum (Mo) or combination thereof. The blanket deposition process may be performed at a temperature of between about 300° C. and about 800° C. and at a pressure of between 1° Torr and 50° Torr.

The blanket deposition process performed in block 550 may include any appropriate deposition process, such as atomic layer deposition (ALD), chemical vapor deposition (CVD), physical vapor deposition (PVD), or the like, at a temperature of between about 100° C. and about 300° C.

Figure 6E:
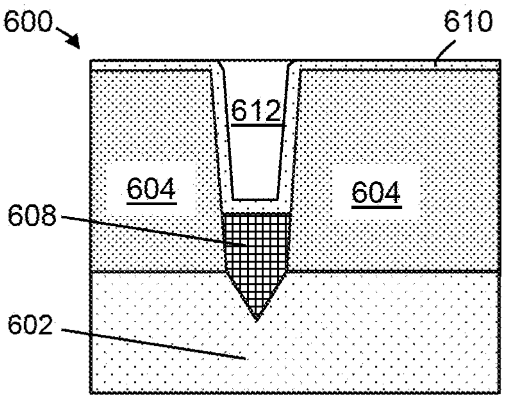

In block 560, a metal fill process is performed to form a contact plug 612 in the trench 606, as shown in FIG. 6E. The contact plug 612 may be formed of contact plug metal material, such as tungsten (W), cobalt (Co), ruthenium (Ru), or molybdenum (Mo). The contact plug 612 may include a metal that has a desirable work function. The metal fill process in block 560 may include a chemical vapor deposition (CVD) process using a tungsten-containing precursor, such as $WF_6$, or a cobalt-containing precursor, in a processing chamber, such as the processing chamber 126 or 128 shown in FIG. 1.

After the metal fill process, the semiconductor structure 600 may be planarized, by use of a chemical mechanical planarization (CMP) process.

The embodiments described herein provide methods and systems for forming a contact epitaxial layer within a trench on a semiconductor device. A contact trench structure includes a metal contact plug formed within the trench, and a contact that interface between the contact plug and a silicon-based channel in the semiconductor device. The contact layer is formed of silicon doped with n-type dopants (e.g., phosphorous (P)) at a high concentration and the dopants are activated by microwave annealing, reducing parasitic resistance.

While the foregoing is directed to embodiments of the present disclosure, other and further embodiments of the disclosure may be devised without departing from the basic scope thereof, and the scope thereof is determined by the claims that follow.

The invention claimed is:

1. A method of forming an electrical contact in a semiconductor structure, comprising:

performing a cavity shaping process to form a cavity on an exposed surface of a semiconductor region within a trench of a dielectric layer;

performing a selective deposition process comprising epitaxially forming a contact layer on the semiconductor region within the trench of the dielectric layer; and performing a microwave anneal process to activate dopants in the epitaxially formed contact layer.

2. The method of claim 1, wherein the selective deposition process and the microwave anneal process are performed without breaking vacuum environment.

3. The method of claim 1, wherein the semiconductor region comprises silicon doped with n-type dopants, and the contact layer comprises silicon doped with n-type dopants.

4. The method of claim 3, wherein the contact layer comprises silicon doped with phosphorous (P) with a concentration of between $10^{19}$ $cm^{-3}$ and $5\cdot\times10^{21}$ $cm^{-3}$.

5. The method of claim 1, wherein the selective deposition process is performed at a temperature of between 200° C. and 800° C.

6. The method of claim 1, further comprising:

prior to the cavity shaping process, performing a pre-clean process to remove contaminants formed on the exposed surface of the semiconductor region within the trench.

7. The method of claim 1, further comprising:

subsequent to the microwave anneal process, performing a blanket deposition process to form a metal layer on the contact layer; and performing a metal fill process to form a contact plug in the trench.

8. A method of forming an electrical contact in a semiconductor structure, comprising:

performing a pre-clean process on a semiconductor structure having a semiconductor region and a dielectric layer having a trench therewithin, the pre-clean process comprising removing contaminants formed on an exposed surface of the semiconductor region within the trench;

performing a cavity shaping process to form a cavity on the exposed surface of the semiconductor region within the trench;

performing a selective deposition process, the selective deposition process comprising epitaxially forming a contact layer in the cavity in the semiconductor region within the trench of the dielectric layer; and performing a microwave anneal process to activate dopants in the epitaxially formed contact layer.

9. The method of claim 8, wherein the pre-clean process, the cavity shaping process, the selective deposition process, and the microwave anneal process are performed without breaking vacuum environment.

10. The method of claim 8, wherein the semiconductor region comprises silicon doped with n-type dopants, and the contact layer comprises silicon doped with n-type dopants.

11. The method of claim 10, wherein the contact layer comprises silicon doped with phosphorous (P) with a concentration of between $10^{19}$ $cm^{-3}$ and $5\cdot\times10^{21}$ $cm^{-3}$.

12. The method of claim 8, wherein the selective deposition process is performed at a temperature of between 200° C. and 800° C.

13. The method of claim 8, further comprising:

subsequent to the microwave anneal process, performing a blanket deposition process to form a metal layer on the contact layer; and performing a metal fill process to form a contact plug in the trench.

14. A processing system, comprising:

a first processing chamber;

a second processing chamber;

a third processing chamber; and a system controller configured to cause the processing system to:

perform, in the first processing chamber, a cavity shaping process to form a cavity on an exposed surface of a semiconductor region within a trench of a dielectric layer;

perform, in the second processing chamber, a selective deposition process comprising epitaxially forming a contact layer on the semiconductor region within the trench of the dielectric layer; and perform, in the second third processing chamber, a microwave anneal process to activate dopants in the epitaxially formed contact layer.

15. The processing system of claim 14, wherein the semiconductor region comprises silicon doped with n-type dopants, and the contact layer comprises silicon doped with n-type dopants.

16. The processing system of claim 15, wherein the contact layer comprises silicon doped with phosphorous (P) with a concentration of between $10^{19}$ $cm^{-3}$ and $5\cdot\times10^{21}$ $cm^{-3}$.

17. The processing system of claim 14, wherein the selective deposition process is performed at a temperature less of between 200° C. and 800° C.

18. The processing system of claim 14, further comprising:

a fourth processing chamber, wherein the system controller is further configured to cause the processing system to:

prior to the cavity shaping process, perform, in the fourth processing chamber, a pre-clean process to remove contaminants formed on the exposed surface of the semiconductor region within the trench.

19. The processing system of claim 18, further comprising:

a fifth processing chamber; and a sixth processing chamber, wherein the system controller is further configured to cause the processing system to:

subsequent to the microwave anneal process, perform, in the fifth processing chamber, a blanket deposition process to form a metal layer on the contact layer; and perform, in the sixth processing chamber, a metal fill process to form a contact plug in the trench.

20. The processing system of claim 14, wherein the system controller is further configured to cause the processing system to perform the selective deposition process and the microwave anneal process without breaking vacuum environment.

* * * * *